(12) United States Patent
Beckwith et al.

(10) Patent No.: US 7,253,720 B2
(45) Date of Patent: Aug. 7, 2007

(54) PROGRAMMABLE PUSH BUTTON

(75) Inventors: Leslie A. Beckwith, La Mirada, CA (US); Wayne L. Russell, Yorba Linda, CA (US)

(73) Assignee: Polara Engineering, Inc., Fullerton, CA (US)

( * ) Notice: Subject to any disclaimer, the term of this patent is extended or adjusted under 35 U.S.C. 154(b) by 132 days.

(21) Appl. No.: 11/089,909

(22) Filed: Mar. 24, 2005

(65) Prior Publication Data

US 2006/0214778 A1 Sep. 28, 2006

(51) Int. Cl.
*G08B 3/00* (2006.01)
(52) U.S. Cl. ............... 340/330; 340/407.1; 340/384.1; 340/521; 200/510; 200/51.16
(58) Field of Classification Search .......... 340/407.1, 340/384.1, 388.1, 521, 407.2, 944, 925, 929, 340/825.46, 330; 200/302.2, 510, 511, 61.45 R, 200/51.16
See application file for complete search history.

(56) References Cited

U.S. PATENT DOCUMENTS 5,315,204 A * 5/1994 Park .......................... 310/339
5,357,566 A * 10/1994 Dowling et al. ....... 379/357.03
6,466,140 B1 * 10/2002 McGaffey et al. .......... 340/944
6,982,630 B2 * 1/2006 Beckwith et al. ........ 340/407.1

* cited by examiner

*Primary Examiner*—Anh V. La
(74) *Attorney, Agent, or Firm*—Morland C. Fischer

(57) ABSTRACT

A programmable push button having a microcontroller located therewithin to provide a switching signal to operate an electronic switch and thereby enable power to be supplied from a source of power to a load to initiate an external event. The push button also has a piezoelectric assembly which is responsive to one or a sequence of manually applied pushing forces at a push button cap. The microcontroller is interconnected with the piezoelectric assembly on a printed circuit board so that output voltage signals generated by the piezoelectric assembly are applied to the microcontroller as a series of digital pulses. The microcontroller can be programmed by applying a particular sequence of pushing forces to the push button cap so that one or more times can be set during which the external event will be initiated or to require a predetermined security code to be entered before the external event can be initiated.

20 Claims, 4 Drawing Sheets

PROGRAMMABLE PUSH BUTTON

BACKGROUND OF THE INVENTION

1. Field of the Invention

This invention relates to a programmable push button having a microcontroller located therewithin to cause power to be applied to a load, whereby an external event can be initiated for a particular time. The push button includes a piezoelectric disc that is responsive to a sequence of manually applied pushing forces that are entered by a user at a push button cap for enabling a corresponding series of pulses to be applied to the microcontroller.

2. Background Art

Time delay relays and push button switches are known to those skilled in the art to cause power to be supplied from a power source to initiate a particular event for a particular predetermined time. The typical time delay relay and its push button switch require wires running therebetween. It is not presently known to combine the time delay relay and the push button switch into a single, compact user programmable push button. Therefore, the conventional relay and switch consume a relatively large amount of space in the field and increase the cost and inconvenience associated with having to purchase and install two independent electrical components.

SUMMARY OF THE INVENTION

In general terms, a programmable push button is disclosed having a main body and a push button cap attached to the top of the main body so as to receive a sequence of user applied pushing forces. A microcontroller is located within the main body and programmed to be responsive to one or more sequences of pushing forces that are applied to the push button cap by the user within a predetermined time in order to initiate an external event. In this same regard, by pushing the push button cap, the microcontroller can be programmed by the user to perform an internal timing function so that external event to be initiated will run for a particular time. By virtue of the foregoing, a user can control an event such as, for example, turning on lights, opening a security gate or garage, activating water sprinklers, energizing motor controlled machinery, and performing activities that require the entry of a security code, all of which depending upon the particular sequence of pushing forces that is applied by the user to the push button cap of the push button.

A resilient O-ring cushion is located on top of the main body of the programmable push button underneath the push button cap. An internal button cup is attached to the bottom of the main body below the push button cap. A resilient bumper is attached (e.g., glued) to the top of the internal button cup. A threaded set screw is carried by the push button cap at the top of the main body. The set screw extends from the push button cap through a central opening in the main body so as to lie above the bumper of the internal button cup at the bottom of the main housing. Located inside the internal button cup is a printed circuit board. The aforementioned microcontroller and a piezoelectric disc assembly are electrically connected to the printed circuit board within the internal button cup.

The piezoelectric disc assembly includes a piezoelectric disc that is sandwiched between upper and lower sidewalls. The piezoelectric disc assembly is connected to the printed circuit board by way of a flex circuit that enables the disc assembly to be folded over itself by which the piezoelectric disc will lie inside the internal button cup in axial alignment with the set screw which extends from the push button cap at the top of the main body and the bumper which is attached to the internal button cup at the bottom of the main housing. In this manner, a manual pushing force applied to the push button cap causes the push button cap to compress the resilient O-ring lying thereunder and the set screw that is carried by the push button cap to be correspondingly advanced into contact with the resilient bumper. The piezoelectric disc is responsive to the manual pushing forces applied to the push button cap and transmitted to the bumper by the set screw. The piezoelectric disc communicates via the flex circuit with the microcontroller so as to generate output voltage signals that are representative of one or more pushing forces being applied by the user to the push button cap.

The output voltage signals generated by the piezoelectric disc are converted into a series of digital pulses to be applied to the microcontroller on the printed circuit board. The microcontroller is responsive to the series of pulses being applied thereto so as to generate an output signal for closing a MOSFET transistor switch on the printed circuit board and thereby causing power to be supplied to a load by way of wires connected to terminal blocks that are carried by the circuit board for enabling the desired external event to be initiated for a particular time interval. A colored LED mounted on a flex circuit that is connected to the printed circuit board will provide a visual indication to the user that the transistor switch has been closed and that power has been applied to the load in order to initiate the corresponding external event that is requested by the user.

DESCRIPTION OF THE PREFERRED EMBODIMENT

Figure 1:
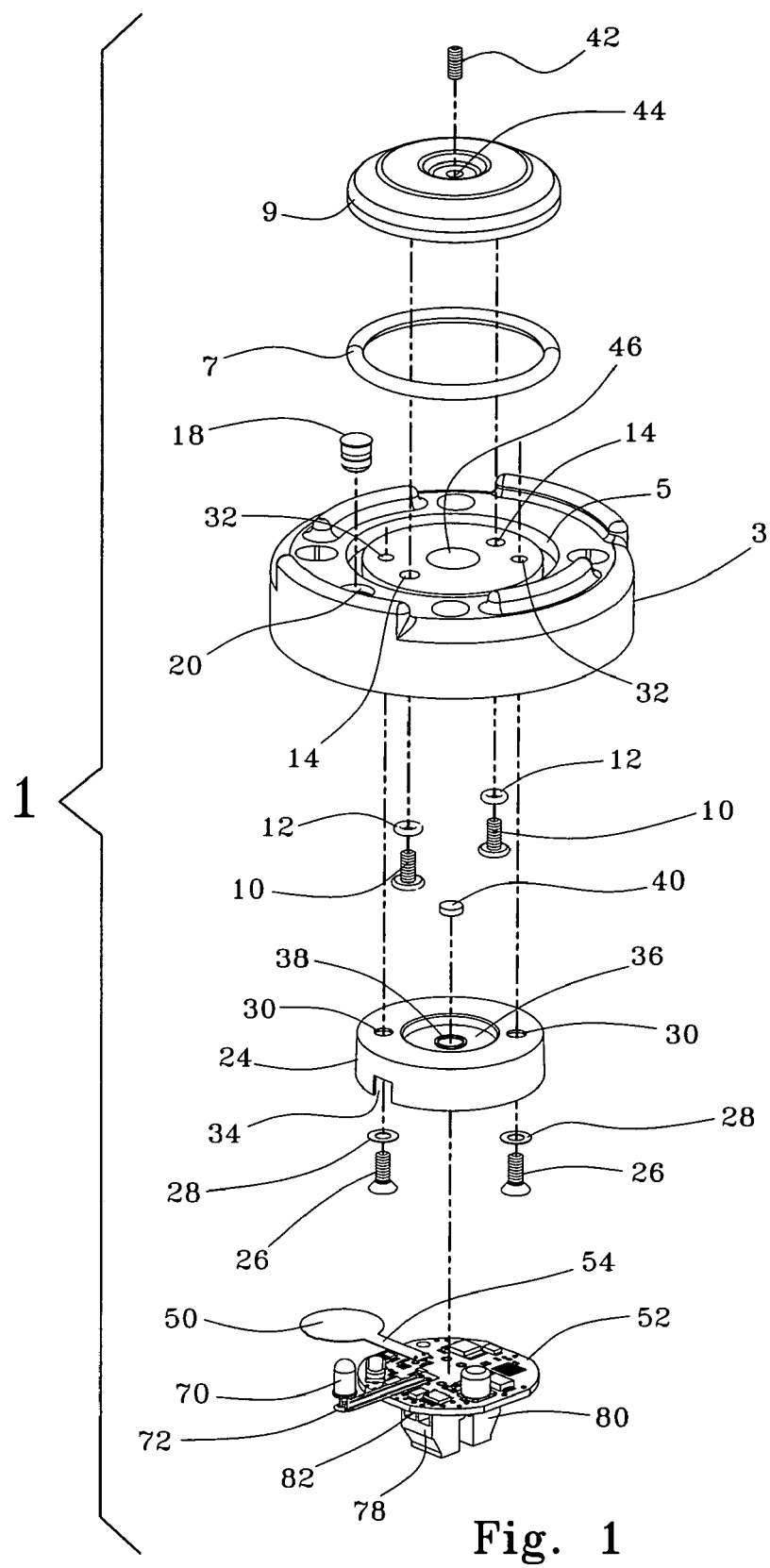
FIG. 1 is an exploded view showing the top of a programmable push button according to a preferred embodiment of this invention.
Figure 2:
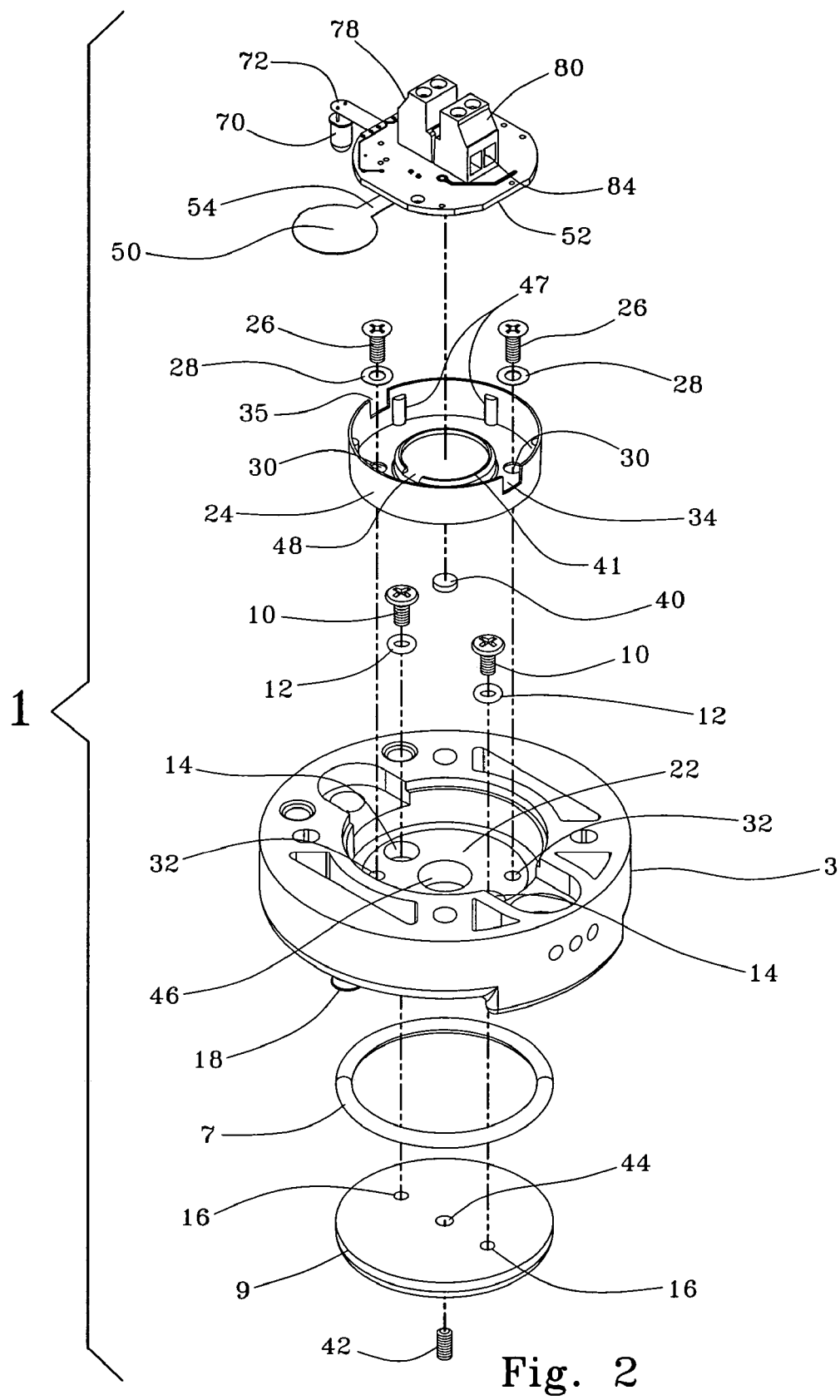
FIG. 2 is an exploded view showing the bottom of the programmable push button of FIG. 1.
Figure 3:
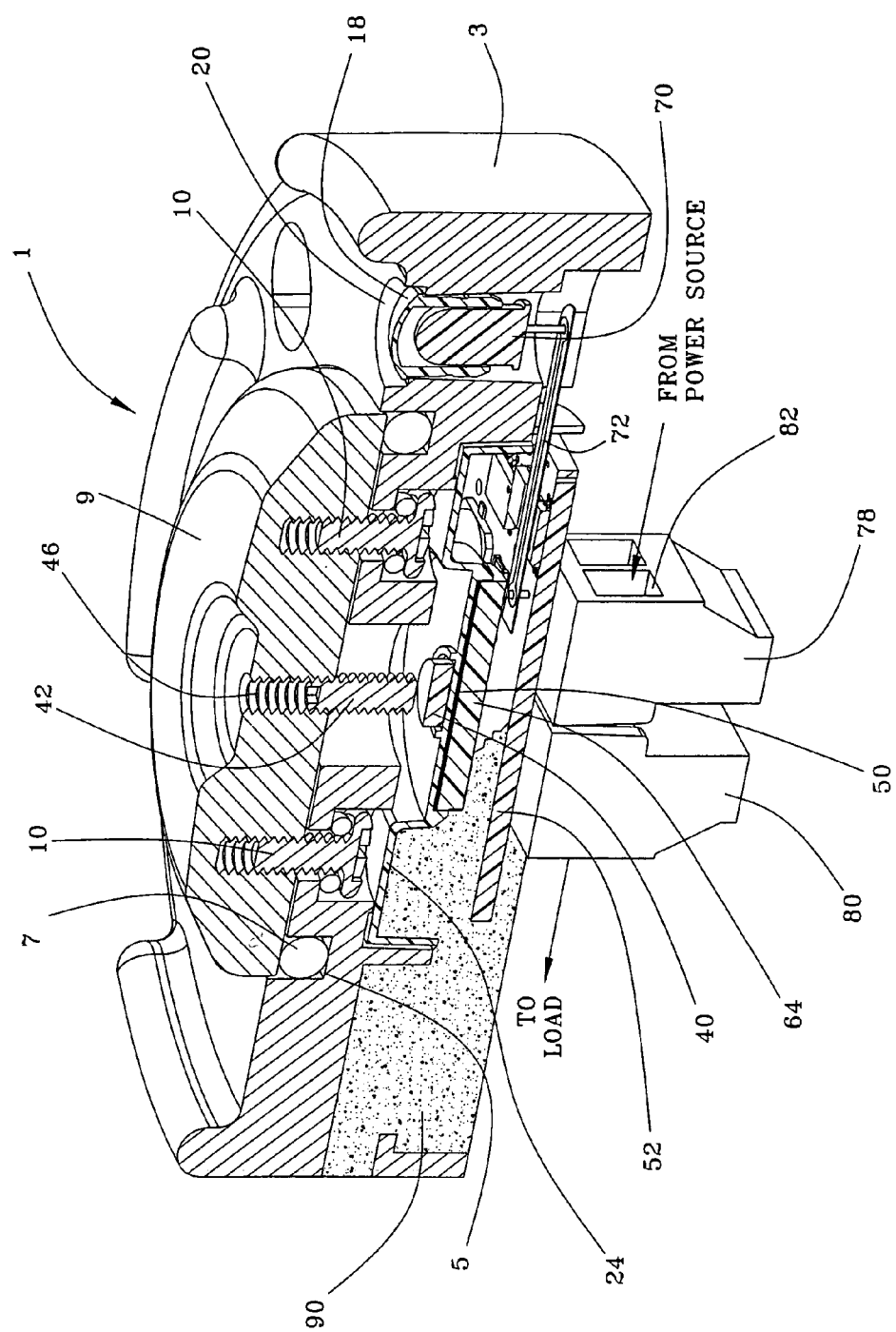
FIG. 3 is a cross-section of the programmable push button in the assembled configuration.

A preferred embodiment for the programmable push button 1 which forms the present invention is initially described while referring concurrently to FIGS. 1-3 of the drawings. FIG. 1 shows an exploded top view of the programmable push button 1, and FIG. 2 shows an exploded bottom view thereof. Push button 1 includes a main body 3 which is preferably manufactured from a weather resistant and tamper-proof metal (e.g., cast aluminum). A circular groove 5 is formed in the top of the main body 3. The groove 5 is sized to receive a resilient (e.g., silicone foam) O-ring 7. Seated on top of the main body 3 so as to lie over the O-ring 7 is a push button cap 9. The resilient O-ring 7 functions as a cushion to support the push button cap 9 slightly above the main body 3. Cap 9 is secured atop the main body 3 by means of suitable fasteners (e.g., button head screws) 10 and respective (e.g., silicone rubber) O-rings 12. The fasteners 10 project upwardly through holes 14 in the main body 3 for receipt by axially aligned holes 16 (best shown in FIG. 2) that are formed in the push button cap 9.

A colored (e.g., red) lens 18 is located in a mounting hole 20 through the top of the main body 3 of push button 1. The lens 18 covers an LED 70 that is controlled by a soon-to-be-described microcontroller (designated 66 in FIG. 5) so that a visual indication can be provided that a particular external event has been initiated in response to a corresponding sequence of pushing forces that has been manually applied to the push button cap 9 against the top of main body 3.

As is best shown in FIG. 2, a (e.g., cylindrical) cavity 22 is formed in the bottom of the main body 3. The cavity 22 is sized to receive therewithin an internal button cup 24. Button cup 24 is secured within the cavity 22 at the bottom of the main body 3 by means of suitable fasteners (e.g., flat head screws) 26 and respective washers 28. The fasteners 26 project upwardly through holes 30 in the button cup 24 for receipt by axially aligned holes 32 that are formed in the main body 3. A pair of oppositely-aligned peripheral slots 34 and 35 are formed in the side wall of button cup 24 for a purpose that will soon be described.

The bottom of the internal button cup 24 is open-ended and the top is closed. In the assembled push button configuration shown in FIG. 3, the cavity 22 of the main body 3 and the interior of button cup 24 are filled with an epoxy 90. A depression 36 is formed in the closed top of the button cup 24. Located at the center of the depression 36 at the top of button cup 24 is a locator ring 38. The locator ring 38 is sized to receive therewithin a resilient (e.g., silicone rubber) bumper 40. The bumper 40 is preferably adhesively bonded to the top of the button cap 24 so as to lie inside the locator ring 38 within the depression 36.

Depending downwardly and inwardly from the closed top of the internal button cup 24 is a raised edge 41 of an attachment surface (best shown in FIG. 2). A set of support posts 47 are located around the periphery of button cup 24 to surround the support ring 41 at the interior of cup 24. The support ring 41 and support posts 47 at the interior of button cup 24 cooperate with a soon to be described printed circuit board 52 and a piezoelectric disc assembly 50 thereof.

In the assembled push button configuration, with the push button cap 9 secured to the top of the main body 3 and the internal button cup 24 located inwardly of the cavity 22 and secured to the bottom of the main body 3, a threaded hex set screw 42 is moved into a threaded screw hole 44 that is formed in the push button cap 9 and past a central opening 46 formed in the top of the main body 3 above which the cap 9 is initially disposed. As is best shown in FIG. 3, the set screw 42 passes through opening 46 so as to lie above the resilient bumper 40 at the top of the internal button cup 24 that is secured inside the cavity 22 at the bottom of main body 3. As will be described in greater detail hereinafter, a manual pushing force applied to the push button cap 9 of the programmable push button 1 will be transmitted to the bumper 40 via set screw 42.

In this regard, the resilient O-ring 7 that is located within the groove 5 at the top of the main body 3 will be compressed by a pushing force applied to the push button cap 9 lying thereover. In this event, the push button cap 9 of the programmable push button 1 is moved towards the main body 3, and the resilient O-ring 7 is compressed against the groove 5. The set screw 42 that is carried by the push button cap 9 is advanced through the central opening 46 in the main body 3 so as to move into contact with and apply a corresponding pressure against the resilient bumper 40 atop the internal button cup 24, whereby to compress the bumper 40. At the end of the pushing force, the O-ring 7 will expand and move the push button cap 9 away from the main body 3 and back to its initial at-rest position.

As an important feature of the programmable push button 1, a piezoelectric disc assembly 50 is interconnected with a printed circuit board 52 by way of a flex circuit 54. The printed circuit board 52 is received inside the internal button cup 24 which is disposed within the cavity 22 at the bottom of the main body 3 of programmable push button 1. In particular, the printed circuit board 52 is seated upon the support posts (designated 47 in FIG. 2), and the edge of circuit board 52 is adhesively bonded to the interior peripheral wall of the button cup 24. As will be described when referring to FIG. 4, the piezoelectric assembly 50 includes a well known piezoelectric disc (designated 56 in FIG. 4) which, in the assembled push button configuration, lies under the bumper 40 that is attached to the top of button cup 24. By virtue of the flex circuit 54, the piezoelectric disc assembly 50 can be folded over itself so as to lay upon the raised edge 41 of the support surface inside button cup 24 with the piezoelectric disc 56 thereof positioned in axial alignment with the bumper 40 atop the button cup 24 and the set screw 42 that is carried by the push button cap 9.

In the folded condition, the flex circuit 54 of piezoelectric disc assembly 50 extends through a notch 48 formed in the raised edge 41 inside the internal button cup 24 (best shown in FIG. 2). In this manner, the piezoelectric disc 56 will be flexed in response to a pushing force that is applied to the push button cap 9, which pushing force will be transmitted by set screw 42 as a pressure to the bumper 40 above the piezoelectric disc assembly 50. The resilient bumper 40 is compressed in order to absorb some of the pushing force applied to push button cap 9 and thereby prevent damage to the piezoelectric disc lying thereunder. While it is preferably to use a force responsive piezoelectric disc, as described above, it is to be understood that other pressure responsive devices (e.g., such as a membrane switch or a microswitch) can be substituted therefor.

Figure 4:
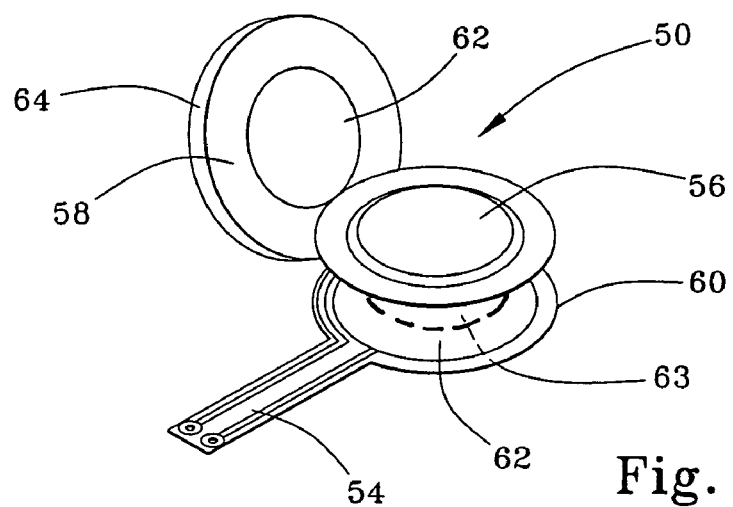
FIG. 4 shows details of a pushing force responsive piezoelectric disc assembly of the programmable push button.

Turning now to FIG. 4 of the drawings, details of the piezoelectric disc assembly 50 are disclosed. As previously indicated, assembly 50 includes a (e.g., 20 mm) piezoelectric disc 56 such as that which is commercially available under Part No. 2-203911 from American Piezo. The piezoelectric disc 56 is located between upper and lower sidewalls 58 and 60 that are hingedly connected together to enable the upper sidewall 58 to be rotated over and closed against the lower sidewall 60. Each of the upper and lower sidewalls 58 and 60 includes a conductive double stick tape 62 to hold the piezoelectric disc assembly 50 closed with the piezoelectric disc 56 sandwiched between the sidewalls 58 and 60. The upper sidewall 58 is covered by a protective foam 64 to prevent damage and to allow the piezoelectric disc 56 to flex against the epoxy 90 with which the internal button cup 24 has been filled.

The lower sidewall 60 of piezoelectric disc assembly 50 is coextensively connected to the flex circuit 54 which, as earlier described, is connected to the printed circuit board 52. As also previously described, the flex circuit 54 allows the disc assembly 50 to be folded over itself to enable the piezoelectric disc 56 that is sandwiched within disc assembly 50 to lay upon the raised edge 41 at the interior of the internal button cup 24 in axial alignment with the bumper 40 that is located atop the internal button cup 24 and the set screw 42 that is carried by push button cap 9 (best shown in FIG. 3). A non-conductive double stick tape 63 is located at the underside of the lower sidewall 60 to hold the disc assembly 50 against the raised edge 41.

Figure 5:
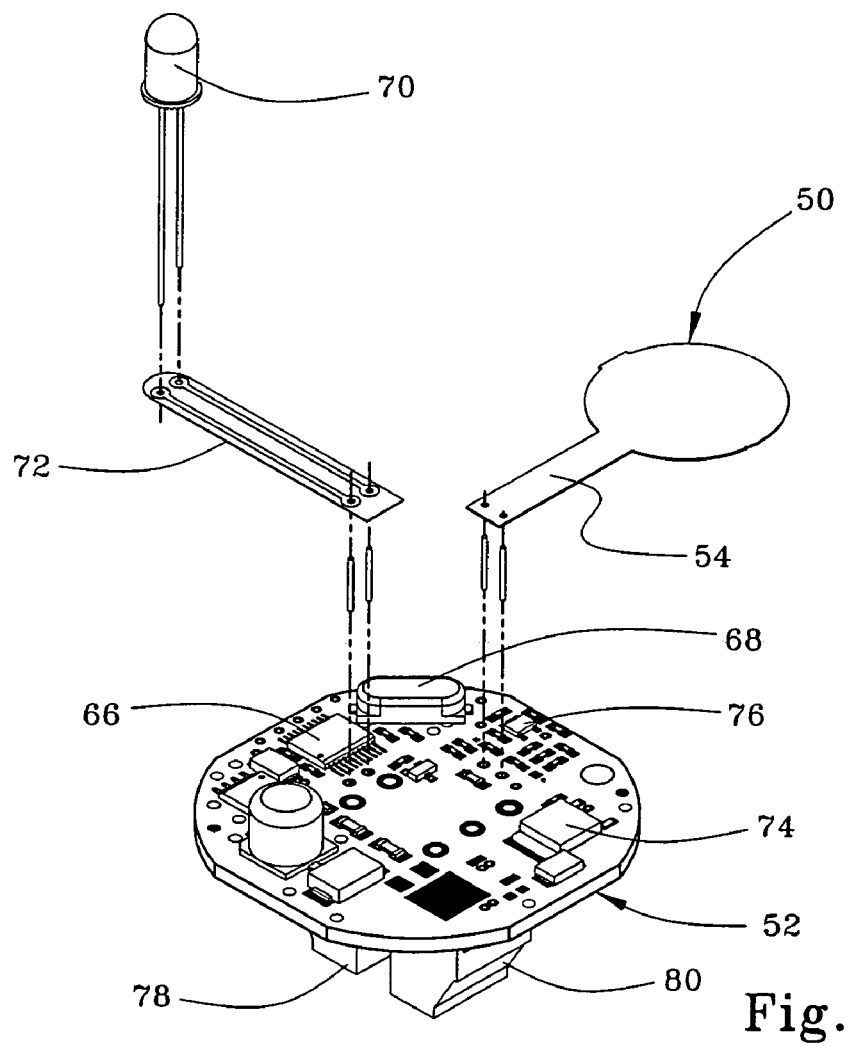
FIG. 5 shows details of a printed circuit board to which the piezoelectric disc assembly of FIG. 4 and a microcontroller are electrically connected.

Referring to FIG. 5 of the drawings, details are disclosed of the printed circuit board 52 which is seated upon the support posts 47 inside the internal button cup 24 of FIGS. 1-3. As just indicated, the piezoelectric disc assembly 50 is electrically connected to the printed circuit board 52 by way of flex circuit 54. Mounted on the printed circuit board 54 is a microcontroller 66. A crystal oscillator 68 is also mounted on the printed circuit board 54 to provide an accurate source of clock signals to microcontroller 66. The microcontroller is a commercially available user programmable device, such as that manufactured under Part No. PIC16F648A by Micro-Chip Technology. The piezoelectric disc assembly 50 communicates with the microcontroller 66 via flex circuit 54 so as to transmit voltage signals thereto that are representative of one or more pushing forces being manually applied by a user to the push button cap 9 of the programmable push button 1 of FIGS. 1-3.

The printed circuit board 52 carries the electronics necessary to convert output voltages generated by the piezoelectric disc 56 into digital pulses to be applied to the microcontroller 66. The printed circuit board 52 also carries an LED 70 which is covered by the colored lens 18 that is located in the mounting hole 18 at the top of the main body 3. The LED 70 is connected to circuit board 52 and interfaced with the microcontroller 66 by way of a flex circuit 72 which extends through one of the peripheral slots 34 or 35 formed in the peripheral wall of the internal button cup 24 (best shown in FIG. 2).

The microcontroller 66 is adapted to detect a single one and/or a series of pulses that are representative of the user successively depressing the push button cap 9 against the main body 3 (of FIGS. 1-3) so as to initiate an external event and cause the LED 70 to provide an indication that the event has occurred. To this end, the microcontroller 66 is programmed to respond to one and/or a series of pulses that are generated within a predetermined time period to initiate any one of a variety of different external events. By way of example only, the push button sequences to which the microcontroller 66 is responsive and which are entered through the push button cap 9 of the programmable push button 1 can turn on outdoor lights, open a security gate or garage, activate water sprinklers, energize motor operated machinery, and control activities which require the entry of a security code.

That is to say, by applying a particular sequence of pushing forces at the push button cap 9 of the programmable push button 1, the microcontroller 66 can be programmed to initiate an external event for a predetermined time. In this case, and once the microcontroller 66 has been programmed for time, a user need only enter a single pushing force at push button cap 9 to cause the microcontroller to close a soon-to-be-described electronic switch 74 on the printed circuit board 52 to enable power to be supplied to a load to run the external event for the particular time. In other cases, by applying a particular sequence of pushing forces to the push button cap 9 of the programmable push button 1, the microcontroller 66 can be programmed to accept a predetermined security code where access to the external event is to be restricted to a limited number of users.

In operation, as the piezoelectric disc 56 flexes in response to the pressure that is applied thereto when the push button cap 9 of push button 1 is depressed, the output voltage generated by disc 56 is supplied to a comparator 76 on the printed circuit board 52. The comparator 76 compares the voltage generated by piezoelectric disc 56 with a reference voltage. If the voltage generated by the disc 56 is greater than the reference voltage (indicative of an actual pushing force applied to cap 9), the comparator 76 generates a corresponding digital pulse to be applied to the microcontroller 66. When the comparator 76 has supplied the microcontroller 66 with one or more pulses according to a particular series of pulses for which the microcontroller has been programmed, the microcontroller 66 will generate an output switching signal to close the electronic switch 74.

The electronic switch 74 is preferably a semiconductor (e.g., MOSFET) transistor switch that is interfaced with a pair of 2-position terminal blocks 78 and 80 that are mounted below the printed circuit board 52. The transistor switch 74 may be any suitable device such as that manufactured under Part No. IRLR024N by International Rectifier Corporation. Each terminal block 78 and 80 contains a respective pair of electrical terminals 82 and 84 to which a pair of electrical wires is to be connected. As is best represented in FIG. 3, a first pair of wires (not shown) extends from a (e.g., 12 or 24 volt DC) power supply to the electrical terminals 82 at the first of the terminal blocks 78. A second pair of wires (also not shown) extends from the electrical terminals 84 at the second of the terminal blocks 80 to a load associated with the event to be initiated.

As just described, when a particular sequence of pushing forces has been successfully entered at the push button cap 9 of push button 1, the microcontroller 66 will generate a switching signal to close the transistor switch 74. Once switch 74 has been closed, power will be supplied from the power source to the load by way of the terminal blocks 78 and 80. Accordingly, the external event will now be initiated and the LED 70 will be illuminated to notify the user that the load associated with the external event has been powered up.

The invention claimed is:

1. A programmable push button to initiate an external event, said push button comprising:
   a push button body;
   a pushing surface supported by said push button body and adapted to move relative to said push button body in response to a pushing force applied to said pushing surface;
   a force transmitting member carried by and movable with said pushing surface;
   a pressure responsive member supported by said push button body and aligned with said force transmitting member carried by said pushing surface, such that a pushing force applied to said pushing surface causes said pushing surface to move relative to said push button body and said force transmitting member to apply a corresponding pressure against said pressure responsive member, said pressure responsive member generating an output electrical signal in response to the pressure applied thereto;
   an electronic switch responsive to said output electrical signal generated by said pressure responsive member for providing power to initiate the external event; and
   a microcontroller electrically connected between said pressure responsive member and said electronic switch, said microcontroller receiving the output electrical signal generated by said pressure responsive member and generating a switching signal to operate said electronic switch, whereby power is provided to initiate the external event.

2. The programmable push button recited in claim 1, wherein said pushing surface is located at one side of said push button body and said pressure responsive member is located at the opposite side of said push button body, said force transmitting member projecting from said pushing surface and extending through an opening formed in said push button body to apply said pressure against said pressure responsive member in response to the pushing force applied to said pushing surface.

3. The programmable push button recited in claim 2, wherein said force transmitting member is a set screw.

4. The programmable push button recited in claim 1, wherein said pressure responsive member is a piezoelectric element.

5. The programmable push button recited in claim 4, wherein said microcontroller and said piezoelectric element are electrically interconnected to one another on a printed circuit board, said printed circuit board located within said push button body.

6. The programmable push button recited in claim 5, wherein said pushing surface is located at the outside of said push button body, and said printed circuit board is located at the inside of said push button body, said pushing surface and said printed circuit board lying in opposing face-to-face alignment with one another.

7. The programmable push button recited in claim 6, wherein said pushing surface has an opening formed therein, said force transmitting member projecting from said pushing surface and extending through said opening to apply said pressure against said piezoelectric element in response to the pushing force applied to said pushing surface.

8. The programmable push button recited in claim 5, wherein said piezoelectric element is connected to said printed circuit board by way of a flexible circuit that is adapted to be folded by which said piezoelectric element is positioned to lie in axial alignment with said force transmitting member.

9. The programmable push button recited in claim 5, further comprising electrical terminal block means attached to said printed circuit board to be interconnected between a power supply and an electrical load of the event to be initiated, said microcontroller generating said switching signal to close said electronic switch so as to enable power to be supplied from the source of power to the load by way of said terminal block means.

10. The programmable push button recited in claim 5, further comprising a light emitting diode electrically connected to said printed circuit board and interconnected with said microcontroller, said microcontroller generating a control signal to provide an indication at said light emitting diode when said microcontroller generates said switching signal to operate said electronic switch and provide power to initiate the external event.

11. The programmable push button recited in claim 1, wherein said microcontroller is responsive to a plurality of pushing forces applied to said pushing surface to set at least one particular time during which said switching signal is generated for operating said electronic switch so that power is provided to initiate the external event.

12. The programmable push button recited in claim 1, wherein said microcontroller is responsive to a plurality of pushing forces applied to said pushing surface according to a predetermined security code to cause said switching signal to be generated for operating said electronic switch so that power is provided to initiate the external event.

13. The programmable push button recited in claim 1, wherein said electronic switch is a transistor switch.

14. A programmable push button to initiate an external event, said push button comprising:
a push button body;
a pushing surface supported by said push button body and adapted to move relative to said push button body to apply a pressure against said push button body in response to a pushing force applied to said pushing surface;
a pressure responsive member generating an electrical output signal in response to the movement of said pushing surface and the pressure applied against said push button body;
a microcontroller to generate a switching signal in response to the electrical output signal generated by said pressure responsive member, said microcontroller and said pressure responsive member being electrically connected to one another on a printed circuit board that is located within said push button body, said pushing surface and said printed circuit board lying in opposing axial alignment with one another; and
an electronic switch connected to said printed circuit board within said push button body and responsive to the switching signal generated by said microcontroller for providing power to initiate the external event.

15. The programmable push button recited in claim 14, wherein said pressure responsive member is a piezoelectric element, said piezoelectric element connected to said printed circuit board by way of a flexible circuit that is adapted to be folded so that said piezoelectric element lies in opposing axial alignment with said pushing surface, said piezoelectric element generating a voltage as the electrical output signal thereof.

16. The programmable push button recited in claim 14, further comprising a pressure transmitting member carried by and movable with said pushing surface, said push button body having an opening formed therein, and said pressure transmitting member projecting from said pushing surface and extending through said opening to apply a pressure to said pressure responsive member corresponding to the pushing force applied to said pushing surface.

17. A programmable push button to initiate different events, said push button comprising:
a push button body;
a pushing surface supported by said push button body and adapted to move relative to said push button body to generate a pushing pressure in response to a pushing force applied to said pushing surface;
a pressure responsive member generating an output electrical signal in response to a movement of said pushing surface and the pushing pressure generated thereby;
a microcontroller to generate a switch signal in response to the electrical output signal generated by said pressure responsive member, said microcontroller being responsive to a plurality of pushing pressures generated by said pushing surface and a corresponding plurality of electrical output signals generated by said pressure responsive member, the switch signal generated by said microcontroller being dependent upon a particular sequence of pushing pressures generated by said pushing surface; and
an electronic switch responsive to the switch signal generated by said microcontroller to cause power to be provided to initiate a particular one of the different events corresponding to the particular sequence of pushing pressures generated by said pushing surface.

18. The programmable push button recited in claim 17, wherein said pressure responsive member is a piezoelectric element, said microcontroller electrically connected between said piezoelectric element and said electronic switch.

19. The programmable push button recited in claim 18, wherein said piezoelectric element, said microcontroller, and said electronic switch are electrically interconnected with one another on a printed circuit board, said printed circuit board being located inside said push button body in axial alignment with said pushing surface.

20. The programmable push button recited in claim 19, further comprising a light emitting diode to be illuminated at the same time that said microcontroller generates said switch signal and said particular one event is initiated, said light emitting diode electrically connected to said printed circuit board inside said push button body.

* * * * *